United States Patent
Kawamura (10) Patent No.: US 9,899,247 B2
(45) Date of Patent: Feb. 20, 2018

(54) CONTAINER TRANSPORT FACILITY

(71) Applicant: Daifuku Co., Ltd., Osaka-shi (JP)

(72) Inventor: Shinsuke Kawamura, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/450,356

(22) Filed: Mar. 6, 2017

(65) Prior Publication Data

US 2017/0256428 A1    Sep. 7, 2017

(30) Foreign Application Priority Data

Mar. 7, 2016    (JP) ................. 2016-043553

(51) Int. Cl.
*H01L 21/677*    (2006.01)

(52) U.S. Cl.
CPC .... *H01L 21/6773* (2013.01); *H01L 21/67769* (2013.01)

(58) Field of Classification Search
CPC ......... H01L 21/67775; H01L 21/67769; H01L 21/67736; H01L 21/67733; H01L 21/6773; H01L 21/67727; H01L 21/67393; B65G 2201/0297
USPC .......................................................... 141/98
See application file for complete search history.

(56) References Cited

U.S. PATENT DOCUMENTS

| | | | |
|---|---|---|---|
| 6,637,998 B2 * | 10/2003 | Langan ............. | H01L 21/67724 414/217 |
| 8,926,251 B2 | 1/2015 | Iizuka et al. | |
| 9,064,921 B2 * | 6/2015 | Shin .................. | H01L 21/67772 |
| 9,230,845 B2 * | 1/2016 | Otsuka .................... | A47F 10/00 |
| 9,520,311 B2 * | 12/2016 | Otsuka ............. | H01L 21/67393 |
| 9,541,534 B2 * | 1/2017 | Otsuka ............... | G01N 33/0009 |
| 9,679,795 B2 * | 6/2017 | Otsuka ............. | H01L 21/67769 |
| 2015/0000785 A1 * | 1/2015 | Shin ........................ | F17C 5/007 141/4 |

FOREIGN PATENT DOCUMENTS

JP    201244033 A    3/2012

* cited by examiner

*Primary Examiner* — Timothy L Maust
*Assistant Examiner* — Andrew Schmid
(74) *Attorney, Agent, or Firm* — The Webb Law Firm (57) ABSTRACT

A storage portion includes a first support portion and a second support portion that support a container. The storage portion is configured to change between a first state and a second state due to the second support portion being raised or lowered. An inert gas supply apparatus includes a connection portion at a height at which the connection portion is connected to the container in the first state and the connection portion is located away from and below the container in the second state. A transport moving body includes a third support portion supporting the container and a protrusion/retraction driving portion that causes the third support portion to protrude and retract. The third support portion is inserted into a transfer space when moved so as to protrude or retract by the protrusion/retraction driving portion. Movement path of the third support portion overlaps with the connection portion in a vertical direction view.

5 Claims, 6 Drawing Sheets

CONTAINER TRANSPORT FACILITY

CROSS-REFERENCE TO RELATED APPLICATION

This application claims priority to Japanese Patent Application No. 2016-043553 filed Mar. 7, 2016, the disclosure of which is hereby incorporated in its entirety by reference.

FIELD OF THE INVENTION

The present invention relates to a container transport facility that includes: a transport moving body that transports a container by moving along a movement route; a storage portion that stores the container; and an inert gas supply apparatus that supplies an inert gas to the interior of the container stored in the storage portion, wherein the container has a bottom surface portion on which a connected portion is included, the storage portion includes a first support portion that supports a first supported portion on the bottom surface portion of the container from below, the inert gas supply apparatus includes a connection portion that is connected to the connected portion of the container in a state in which the container is supported by the first support portion, and the inert gas supply apparatus supplies the inert gas from the connection portion to the interior of the container via the connected portion.

BACKGROUND

An example of the above-described container transport facility is disclosed in JP 2012-044033A (Patent Document 1). With the container transport facility disclosed in Patent Document 1, a storage portion that stores a container is included on the lateral side of a movement route on which the transport moving body moves, and the inert gas supply apparatus supplies the inert gas to the container stored in the storage portion. Thus, with the container transport facility disclosed in Patent Document 1, by including the inert gas supply apparatus, the inert gas can be supplied to the interior of the container using the period of storing the container in the storage portion.

To give additional description, the transport moving body includes a transport support portion by which the upper portion of the container is supported in a hanging manner, and an elevation driving portion that raises and lowers the transport support portion. The storage portion includes a storage support portion that supports the lower surface portion of the container from below, and a slide driving portion that causes the storage support portion to move in a sliding manner in the horizontal direction.

Also, the storage support portion supports the connection portion of the inert gas supply apparatus, and the bottom surface portion of the container includes a connected portion. In the state in which the bottom surface portion of the container is supported from below by the storage support portion, the connection portion of the inert gas supply apparatus is connected to the connected portion of the container, and thus the inert gas can be supplied to the interior of the container.

Also, in the state in which the transport moving body is stopped at a transport stopping position set on the lateral side of the storage portion, the storage portion causes the storage support portion to protrude using the slide driving portion, whereafter the transport moving body raises and lowers the transport support portion using the elevation driving portion, and thereafter the storage portion retracts the storage support portion using the slide driving portion so as to store the container in the storage portion or take the container from the storage portion.

SUMMARY OF THE INVENTION

With the container transport facility disclosed in Patent Document 1, the transport moving body is configured such that the container is supported in a hanging manner from above by the transport support portion, but there are cases where the transport moving body is configured such that the bottom surface portion of the container is supported from below by the transport support portion. Thus, in the case where the bottom surface portion of the container is supported from below by the transport support portion, it is necessary to support the bottom surface portion from below while avoiding interfering with the connection portion connected to the bottom surface portion of the container, and therefore it is difficult to stably support the container.

In view of this, there is demand for a container transport facility in which a transport moving body can stably support the bottom surface portion of the container from below, and inert gas can be supplied to the container stored in the storage portion.

A characteristic configuration of a container transport facility achieved in light of the foregoing circumstances lies in that in a container transport facility including: a transport moving body configured to transport a container by moving along a movement route; a storage portion configured to store the container; and an inert gas supply apparatus configured to supply an inert gas to an interior of the container stored in the storage portion, wherein the container has a bottom surface portion including a connected portion, the storage portion includes a first support portion that supports a first supported portion on the bottom surface portion of the container from below, the inert gas supply apparatus includes a connection portion that is connected to the connected portion of the container in a state in which the container is supported by the first support portion, and the inert gas supply apparatus supplies an inert gas from the connection portion to the interior of the container via the connected portion, the storage portion includes: a second support portion configured to support, from below, a second supported portion, which is a portion that is different from the first supported portion on the bottom surface portion of the container and is a portion at which the connected portion does not exist; and an elevation driving portion configured to raise and lower the second support portion, the storage portion being configured to be able to change to a first state and a second state due to the second support portion being raised and lowered by the elevation driving portion, with a height of the container supported by the first support portion being a first height, and a height of the container supported at a height higher than the first height being a second height, the first state is a state in which the second support portion is lowered to be below the second supported portion of the container at the first height and the container can be supported by the first support portion at the first height, the second state is a state in which the second supported portion is raised to be above the second supported portion of the container at the first height and the container can be supported by the second support portion at the second height, the inert gas supply apparatus includes the connection portion at a height at which, in a state in which the storage portion has been changed to the first state, the connection portion is connected to the connected portion of the container at the first height, and in a state in which the storage portion has been changed to the second state, the connection portion is located away from and below the connected portion of the container at the second height and a transfer space is formed between the bottom surface portion of the container and the connection portion, the transport moving body includes: a third support portion that supports, from below, a third supported portion, which is a portion that is different from the second supported portion on the bottom surface portion of the container; and a protrusion/retraction driving portion configured to cause the third support portion to protrude and retract along an alignment direction in which the transport moving body and the storage portion are aligned in a state in which the transport moving body is stopped at a transfer stopping position set on a lateral side of the storage portion, a movement path at the time when the third support portion is moved so as to protrude or retract by the protrusion/retraction driving portion overlaps with the connection portion in a view in the vertical direction, and the transport moving body causes the third support portion to move so as to protrude or retract using the protrusion/retraction driving portion, causing the third support portion to enter the transfer space of the storage portion in the second state, and the transport moving body takes the container from the storage portion with the container supported by the third support portion, or the transport moving body stores the container in the storage portion with the container supported by the second support portion.

According to this characteristic configuration, the storage portion includes the first support portion, the second support portion, and the elevation driving portion. The first support portion supports the first supported portion on the bottom surface portion of the container from below, and the second support portion supports a position different from that of the first supported portion on the bottom surface portion of the container from below. For this reason, by raising or lowering the second support portion using the elevation driving portion, the state of the storage portion can be changed to a first state in which the container can be supported at a first height by the first support portion, and a second state in which the container can be supported at a second height by the second support portion.

Also, in the state in which the storage portion has been changed to the first state, the connection portion of the inert gas supply apparatus is connected to the connected portion of the container, and therefore the inert gas can be supplied to the interior of the container. Also, in the state in which the storage portion has been changed to the second state, a transfer space is formed between the container supported by the second support portion and the connection portion of the inert gas supply apparatus. Accordingly, even if the movement path at the time when the third support portion of the transport moving body is moved so as to protrude or retract by the protrusion/retraction driving portion overlaps with the connection portion in a view in the vertical direction, the third support portion can be moved so as to protrude or retract without interfering with the connection portion, due to the third support portion being moved so as to protrude or retract and being inserted into the transfer space.

Note that when the shape of the third support portion is set, the shape in plan view can be set without giving consideration to interfering with the connection portion at the time when the third support portion is moved so as to protrude or retract. For this reason, the shape of the third support portion is easily formed into a shape that can stably support the container, while the connection portion of the inert gas supply apparatus is supported by the first support portion of the storage portion.

Accordingly, it is possible to provide a container transport facility in which the transport moving body can stably support the bottom surface portion of the container from below, and inert gas can be supplied to the container stored in the storage portion.

DETAILED DESCRIPTION

Hereinafter, embodiments of a container transport facility will be described with reference to the drawings.

Figure 1:
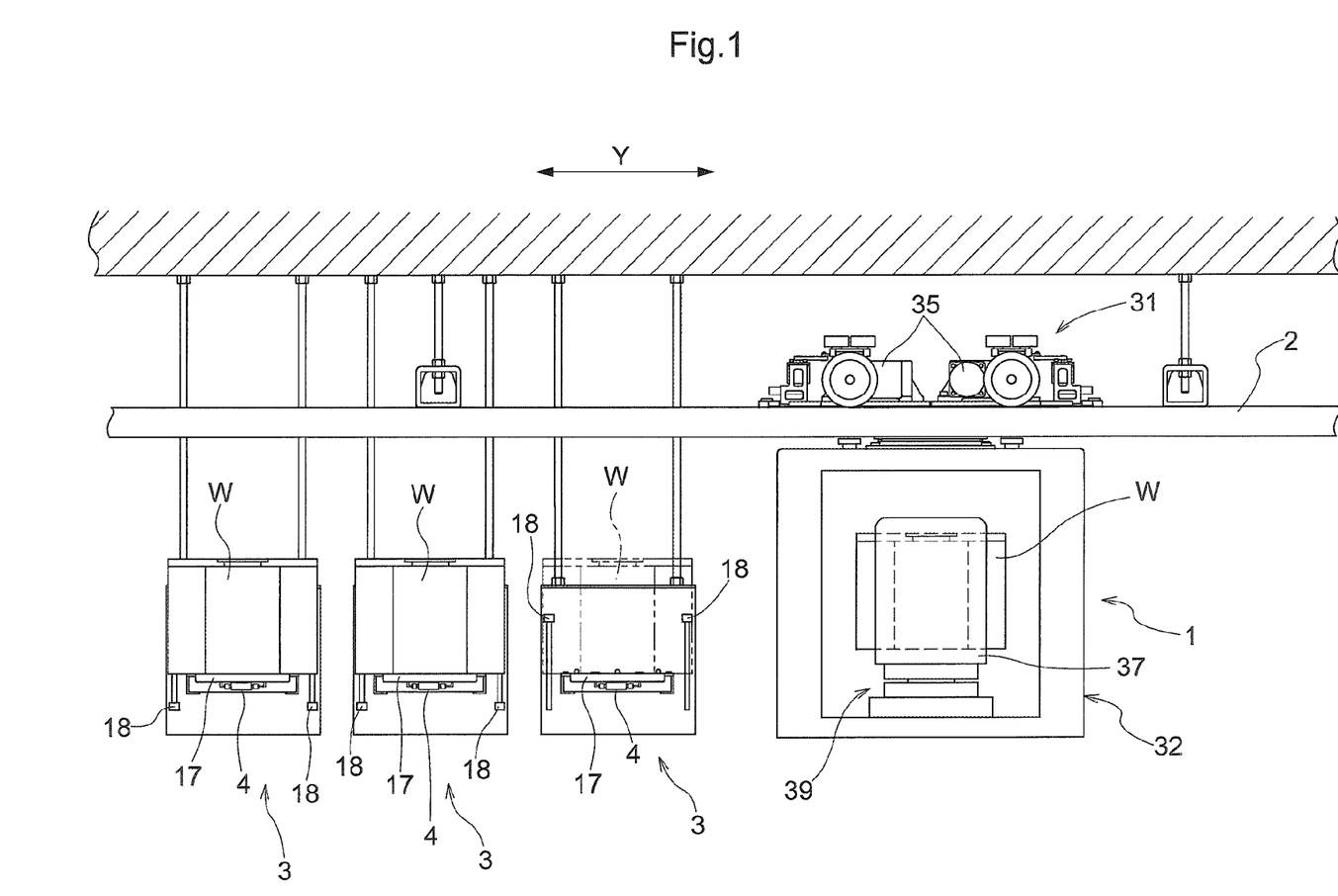
FIG. 1 is a front view of a container transport facility.

As shown in FIG. 1, the container transport facility includes a container transport vehicle 1, a travel rail 2, storage portions 3, and nitrogen gas supply apparatuses 4. The travel rail 2 is installed along a travel route (movement route) and is supported in a hanging manner on a ceiling. The container transport vehicle 1 transports a container W by traveling on the travel rail 2 along the movement route. The container transport vehicle 1 corresponds to a transport moving body that transports the container W by moving along the movement route. The storage portions 3 are supported in a hanging manner on the ceiling, and are each configured to be able to store one container W. The nitrogen gas supply apparatuses 4 each supply nitrogen gas as an inert gas to the interior of a container W stored in a storage portion 3. The nitrogen gas supply apparatuses 4 correspond to inert gas supply apparatuses that supply an inert gas.

Hereinafter, the direction in which the container transport vehicle 1 and the storage portion 3 are aligned in the state in which the container transport vehicle 1 is stopped at the transfer stopping position set on the lateral side of the storage portion 3 will be referred to as "alignment direction X". Also, the direction orthogonal to the alignment direction X in a view in the vertical direction will be referred to as "width direction Y".

Also, in the state in which the container transport vehicle 1 is stopped at the transfer stopping position set on the lateral side of the storage portion 3, the direction in which the storage portion 3 exists relative to the container transport vehicle 1 in the alignment direction X is referred to as "first direction X1", and the direction opposite thereto is referred to as "second direction X2".

The container W can accommodate multiple substrates and detachably includes a lid (not shown) that can cover an opening for taking out and inserting substrates. In the present embodiment, semiconductor wafers are used as the substrates, and FOUPs (Front Opening Unified Pods) that accommodate the semiconductor wafers are used as the containers.

The container transport vehicle 1 transports the container W to the storage portion 3 so as to store the container W in the storage portion 3, takes out a container W stored in the storage portion 3 from the storage portion 3, and transports the container W.

The storage portions 3 are installed on the lateral side of the travel route (movement route) of the container transport vehicle 1, and multiple storage portions 3 are installed along the width direction Y.

Containers

Figure 2:
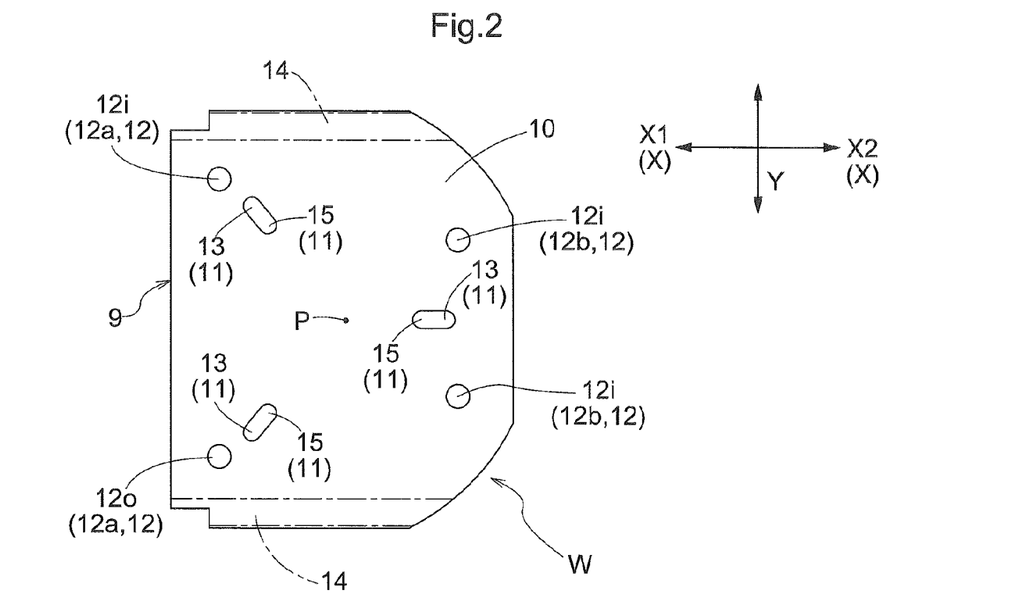
FIG. 2 is a bottom surface view of a container.

As shown in FIG. 2, the container W includes a detachable lid (not shown) that closes a substrate entrance that is formed on a front surface portion 9 and is for taking out and inserting substrates. The container W is stored in the storage portion 3 in a state in which the front part thereof faces the first direction X1 and the rear part thereof faces the second direction X2. Note that the width direction Y and the alignment direction X in the description of the container W are defined based on a state in which the container W is stored in the storage portion 3.

As shown in FIG. 2, a bottom surface portion 10 of the container W includes recessed portions 11 that are three grooves that are recessed upward. The three recessed portions 11 are formed with the lengthwise directions of the recessed portions 11 aligned in radial directions centered about a bottom surface reference position P. Also, the three recessed portions 11 are each formed into a tapered shape whose width decreases as its height increases, and the inner surfaces of the recessed portions 11 are formed into inclined surfaces. Note that the three recessed portions 11 correspond to engaged portions provided in the container W. Also, the two recessed portions 11 located on the first direction X1 side with respect to the bottom surface reference position P correspond to the recessed portions 11 that are included on the first direction X1 side relative to second connected portions 12b and have portions that overlap with the second connected portions 12b in a view in the alignment direction X.

The container W includes four connected portions 12 on the bottom surface portion 10. As the connected portions 12, the container W includes a pair of first connected portions 12a that are located on the first direction X1 side (frontward) with respect to the center of the container W in a view in the vertical direction, and a pair of second connected portions 12b that are located on the second direction X2 side (rearward) with respect to the center of the container W in a view in the vertical direction.

The pair of first connected portions 12a are arranged in alignment in the width direction Y (the left-right direction of the container W), and the pair of first connected portions 12a overlap in a view in the width direction Y. Similarly to the pair of first connected portions 12a, the pair of second connected portions 12b are also arranged in alignment in the width direction Y (the left-right direction of the container W), and the pair of second connected portions 12b overlap in a view in the width direction Y.

The installation interval of the pair of second connected portions 12b is narrower than the installation interval of the pair of first connected portions 12a, and the pair of second connected portions 12b are installed between the pair of first connected portions 12a in the width direction Y.

One of the pair of first connected portions 12a is a gas supply portion 12i, and the other of the pair of first connected portions 12a is a gas discharge portion 12o. Both of the pair of second connected portions 12b are gas supply portions 12i.

The gas supply portion 12i is a portion for supplying the inert gas that has been ejected from a gas supply connection portion 24i of the nitrogen gas supply apparatus 4 to the interior of the container W, and the gas supply portion 12i includes a gas supply on-off valve (not shown). The gas discharge portion 12o is a portion for discharging the gas inside of the container W, and the gas discharge portion 12o includes a gas discharge on-off valve (not shown). In other words, the container W is configured to be air-tight due to the substrate entrance of the container W being closed with a lid, and the three gas supply portions 12i and the one gas discharge portion 12o being closed with an on-off valve.

The gas supply on-off valve of the gas supply portion 12i is biased to be in a closed state by a biasing body such as a spring, and if nitrogen gas is ejected from the gas supply connection portion 24i in the state in which the gas supply connection portion 24i of the nitrogen gas supply apparatus 4 is connected to the gas supply portion 12i, the gas supply on-off valve is operated so as to open due to the pressure of the ejected nitrogen gas, and the nitrogen gas is supplied to the interior of the container W.

Also, the gas discharge on-off valve of the gas discharge portion 12o is biased to be in the closed state by a biasing body such as a spring, and if the pressure inside of the container W increases due to the nitrogen gas being supplied by the nitrogen gas supply apparatus 4, the gas discharge on-off valve is operated so as to open due to the pressure, and the gas inside of the container W is discharged.

A portion that is supported from below by the first support portion 17 of the storage portion 3 on the bottom surface portion 10 of the container W is used as a first supported portion 13. Also, a portion that is supported from below by the second support portion 18 of the storage portion 3 on the bottom surface portion 10 of the container W is used as a second supported portion 14. Also, a portion that is supported from below by a third support portion 37 of a container transport vehicle 1 on the bottom surface portion 10 of the container W is used as a third supported portion 15.

Regarding the first supported portion 13 and the third supported portion 15, the recessed portion 11 is divided into two parts at the lengthwise direction center, the portion near a bottom surface reference position P among the two portions obtained by dividing the recessed portion 11 into two parts is used as the third supported portion 15, and the remaining portion of the recessed portion 11 is used as the first supported portion 13. Also, portions on the outer side in the width direction Y with respect to the pair of first connected portions 12a on the bottom surface portion 10 of the container W are used as the second supported portions 14.

Thus, the second supported portions 14 of the container W are portions that are different from the first supported portions 13 of the container W and are portions at which the connected portions 12 do not exist. Also, the third support portions 15 of the container W are portions that are different from the first supported portions 13 and the second supported portions 14 of the container W and are portions at which the connected portions 12 do not exist.

Storage Portion

Figure 3:
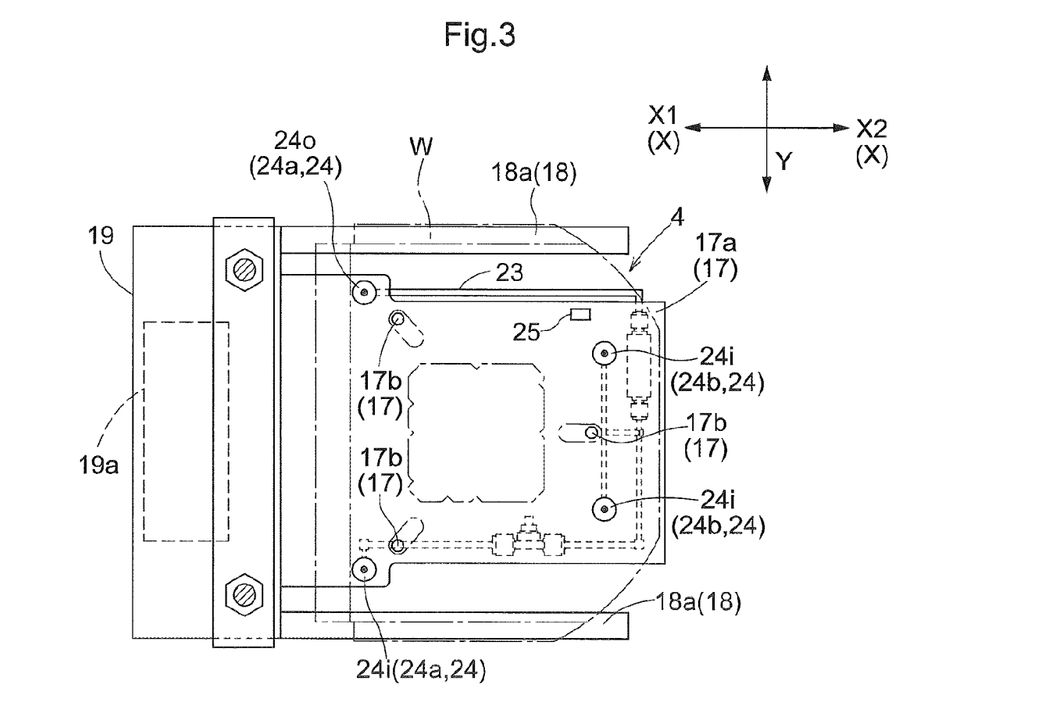
FIG. 3 is a plan view of a storage portion.
Figure 4:
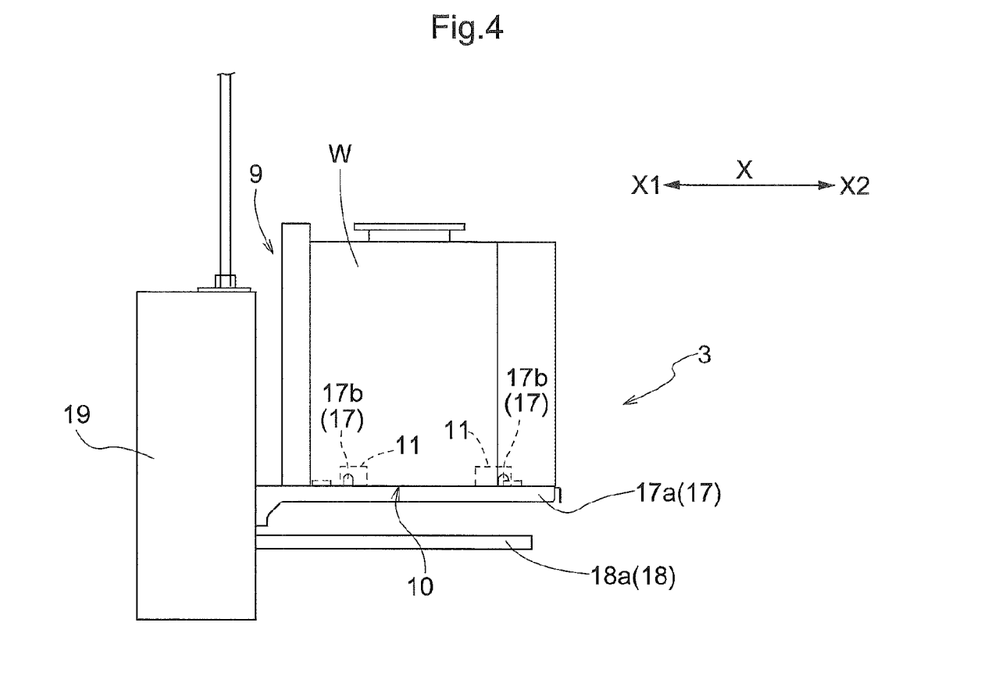
FIG. 4 is a side view showing a storage portion in a first state.
Figure 5:
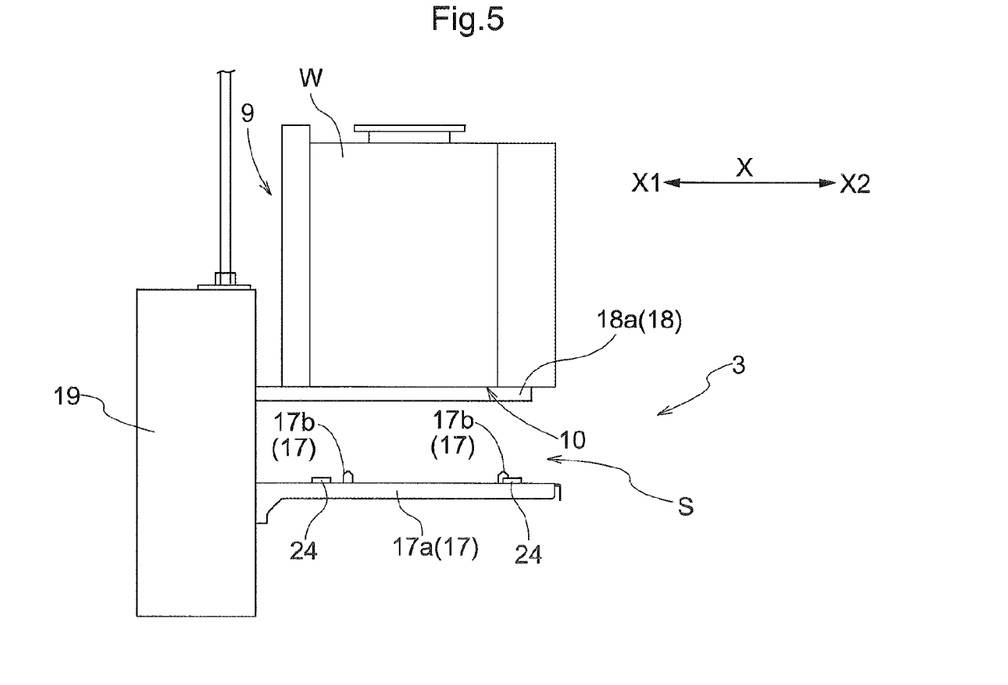
FIG. 5 is a side view showing a storage portion in a second state.

As shown in FIGS. 3 to 5, the storage portion 3 includes the first support portion 17, the second support portions 18, and a base portion 19.

The first support portion 17 and the base portion 19 are installed in a state of being fixed with respect to the ceiling by being supported in a hanging manner from the ceiling by a support member connected to the ceiling. The first support portion 17 includes a flat first base plate 17a and three first engagement portions 17b that protrude upward from the first base plate 17a.

Also, the first support portion 17 supports the first supported portions 13 of the container W from below using the three first engagement portions 17b in a state in which the three first engagement portions 17b are engaged with the three recessed portions 11 of the container W. Thus, the first support portion 17 supports the first supported portion 13 on the bottom surface portion 10 of the container W from below.

The second support portions 18 are installed in the storage portion 3 in a state of being able to move along the vertical direction. The second support portions 18 are constituted by a pair of rod-shaped support bodies 18a that extend in the alignment direction X. A pair of support bodies 18a are installed on both sides in the width direction Y of the first support portion 17 in a view in the vertical direction. Also, the second support portion 18 supports the second supported portion 14 on the bottom surface portion 10 of the container W from below using the pair of support bodies 18a. Thus, the second support portions 18 supports the second supported portions 14 on the bottom surface portion 10 of the container W from below.

The base portion 19 includes an elevation motor 19a serving as an elevation driving portion that integrally raises and lowers the pair of support bodies 18a so as to raise and lower the second support portions 18. Due to the driving of the elevation motor 19a, the pair of support bodies 18a (second support portion 18) are raised and lowered to a withdrawal height (height shown in FIG. 4) and to a support height (height shown in FIG. 5) that is higher than the withdrawal height. The elevation motor 19a is installed on the first direction X1 side relative to the first support portion 17.

As shown in FIGS. 4 and 5, the storage portion 3 is configured to be able to change to a first state (state shown in FIG. 4) and a second state (state shown in FIG. 5) due to the second support portions 18 being raised and lowered by the elevation motor 19a.

Next, the first state and the second state of the storage portion 3 will be described, but description will be given in which the height of the container W supported by the first support portion 17 is a first height (height shown in FIG. 4) and the height of the container W supported at a height that is higher than the first height is a second height (height shown in FIG. 5).

As shown in FIG. 4, the first state is a state in which the second support portion 18 has been lowered to the withdrawal height. In the first state, the second support portion 18 has been lowered to be below the second supported portion 14 in the container W at the first height, and a state has been entered in which the container W can be supported by the first support portion 17 at the first height.

As shown in FIG. 5, the second state is a state in which the second support portion 18 has been raised to the support height. In the second state, the second supported portion 14 has been raised to be above the second supported portion 14 in the container W at the first height, and a state has been entered in which the container W can be supported by the second support portion 18 at the second height.

To give additional description, in the first state, the second support portion 18 is located at the withdrawal height, and the container W stored in the storage portion 3 is supported at the first height by the first support portion 17. Also, the second support portion 18 is located away from and below the second supported portions 14 of the container W.

By raising the second support portion 18 from this state, in the process of raising the second support portions 18 from the withdrawal height to the support height, the second support portions 18 come into contact with the second supported portions 14 of the container W. Also, due to the second support portions 18 being raised to the support height so as to change the storage portion 3 to the second state, the container W supported by the first support portion 17 is supported at the second height by the second support portions 18, and the first support portion 17 is located away from and below the first supported portions 13 of the container W.

Also, in the second state, the second support portions 18 are located at the support height and the container W stored in the storage portion 3 is supported at the second height by the second support portions 18. Also, the first support portion 17 is located away from and below the first supported portions 13 of the container W.

Due to the second support portions 18 being lowered from this state, in the process of lowering the second support portions 18 from the support height to the withdrawal height, the first support portion 17 comes into contact with the first supported portions 13 of the container W (the three first engagement portions 17b of the first support portion 17 engage with the three recessed portions 11 of the container W), and the container W supported by the second support portions 18 is supported at the first height by the first support portion 17. Also, the second support portions 18 are lowered to the withdrawal height so as to change the storage portion 3 to the first state, whereby the second support portions 18 are located away from and below the second supported portions 14 of the container W.

Incidentally, when the first support portion 17 comes into contact with the first supported portions 13 of the container W to support the container W, the three first engagement portions 17b of the first support portion 17 engage with the three recessed portions 11 of the container W from below. When the first support portion 17 engages with the container W in this manner, if the container W supported by the first support portion 17 is misaligned in the horizontal direction relative to the correct support position of the first support portion 17, the first engagement portions 17b are guided to the inner surfaces of the recessed portions 11 so that the container W moves in the horizontal direction, and the position in the horizontal direction of the container W is corrected to be the appropriate support position of the first support portion 17.

Nitrogen Gas Supply Apparatus

As shown in FIGS. 1 and 3, one nitrogen gas supply apparatus 4 is provided per storage portion 3, and each nitrogen gas supply apparatus 4 includes three gas supply connection portions 24i, one gas discharge connection portion 24o, and a pipe 23 connected to the three gas supply connection portions 24i.

The three gas supply connection portions 24i are supported by the first support portion 17 so as to be connected to the three gas supply portions 12i of the container W in a state in which the container W is supported by the first support portion 17. The one gas discharge connection portion 24o is supported by a first support portion 17 so as to be connected to the one gas discharge portion 12o of the container W in a state in which the container W is supported by the first support portion 17.

Thus, with respect to one storage portion 3, the nitrogen gas supply apparatus 4 includes four connection portions 24 (three gas supply connection portions 24i and one gas discharge connection portion 24o) that are connected to the connected portions 12 of the container W in a state in which the container W is supported by the first support portion 17. Note that among the four connection portions 24, the two connection portions 24 that are connected to the first connected portion 12a of the container W are referred to as first connection portions 24a, and the two connection portions 24 that are connected to the second connected portions 12b of the container W are referred to as second connection portions 24b.

The nitrogen gas supply apparatus 4 causes the nitrogen gas from a supply source (not shown) to flow through the interiors of the pipes 23 so as to supply the nitrogen gas to the three gas supply connection portions 24i, and supplies the supplied nitrogen gas from the three gas supply connection portions 24i to the interior of the container W via the three gas supply portions 12i. Thus, the nitrogen gas supply apparatus 4 supplies the nitrogen gas from a portion of the four connection portions 24 to the interior of the container W via a portion of the four connected portions 12.

The connection portions 24 of the nitrogen gas supply apparatus 4 are installed at a height at which, in the state in which the storage portion 3 has been changed to the first state as shown in FIG. 4, the connection portions 24 of the nitrogen gas supply apparatus 4 are connected to the connected portions 12 of the container W at the first height, and in the state in which the storage portion 3 has been changed to the second state as shown in FIG. 5, the connection portions 24 are located away from and below the connected portions 12 of the container W at the second height.

In the state in which the storage portion 3 has been changed to the second state, the transfer space S is formed between the bottom surface portion 10 of the container W and the connection portions 24 of the nitrogen gas supply apparatus 4.

The storage portion 3 includes a presence sensor 25 that detects whether or not there is a container W being supported by the first support portion 17. Based on the detection information of the presence sensor 25, the nitrogen gas supply apparatus 4 switches between a state of ejecting the nitrogen gas from the gas supply connection portions 24i and a state of not ejecting the nitrogen gas.

Container Transport Vehicle

Figure 6:
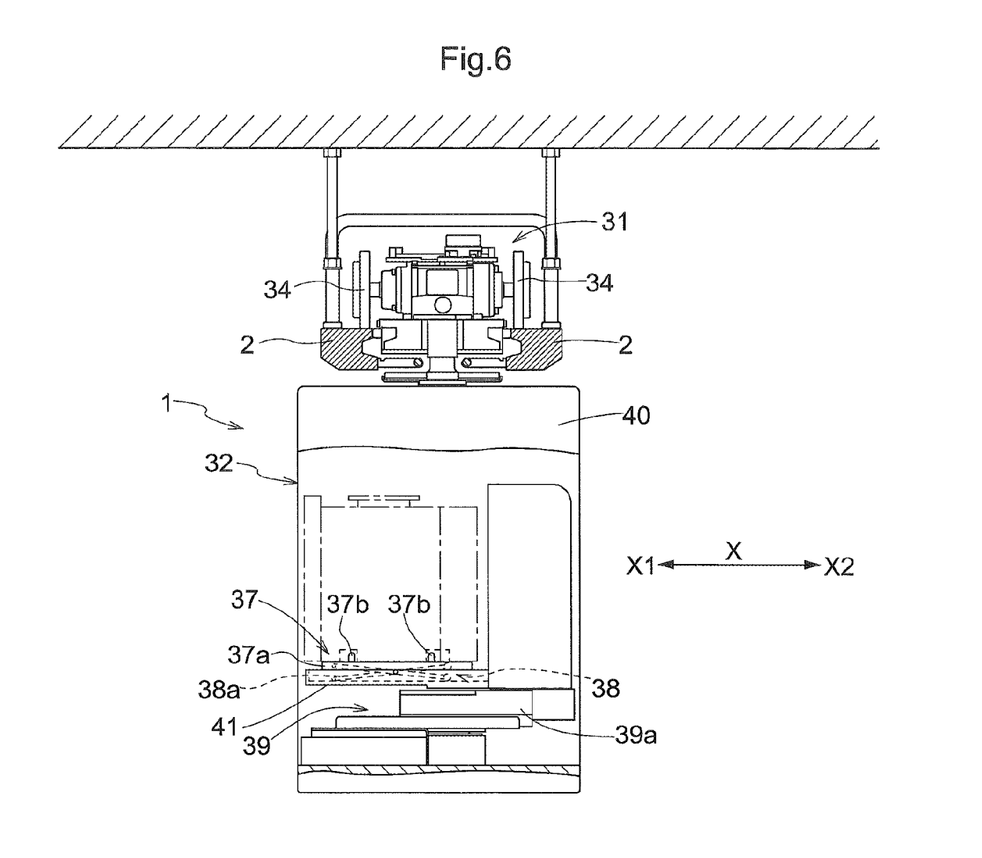
FIG. 6 is a side view of a container transport vehicle.

As shown in FIG. 6, the container transport vehicle 1 includes a travel portion 31 that travels on the travel rail 2 supported by the ceiling, and a main body portion 32 that is supported by hanging from the travel portion 31 so as to be located below the travel rail 2.

The travel portion 31 includes a driving wheel 34 that rolls on the upper surface of the travel rail 2, and a travel motor 35 that drives the driving wheel 34 so as to rotate. Also, the travel portion 31 is configured such that the travel portion 31 travels along the travel route (movement route) due to the driving wheel 34 being driven so as to rotate by the travel motor 35.

The main body portion 32 includes third support portions 37 that support the bottom surface portion 10 of the container W from below, an elevation operation mechanism 38 that moves the third support portions 37 up and down, a protrusion/retraction operation mechanism 39 that moves the elevation operation mechanism 38 and the third support portions 37 in the alignment direction X, and a cover body 40 that covers both sides in the vertical direction and both sides in the width direction Y of the container W supported by the third support portion 37.

The third support portion 37 includes a flat third base portion 37a and three third engagement portions 37b that protrude upward from the third base portion 37a. Also, the third support portion 37 supports the third supported portions 15 of the container W from below using three third engagement portions 37b in a state in which the three third engagement portions 37b are engaged with the three recessed portions 11 of the container W. Thus, the third support portion 37 supports the third supported portions 15, which are different from the first supported portions 13 and the second supported portions 14 on the bottom surface portion 10 of the container W, from below. Note that the third engagement portions 37b correspond to engagement portions included in the third support portion 37.

The elevation operation mechanism 38 includes an elevation link mechanism 38a that extends and contracts in the vertical direction due to the driving performed by an elevation motor (not shown). The third support portion 37 is coupled to the upper end portion of the elevation link mechanism 38a and a relay portion 41 is coupled to the lower end portion of the elevation link mechanism 38a.

Due to the elevation link mechanism 38a extending and contracting in the vertical direction due to the elevation motor, the elevation operation mechanism 38 raises and lowers the third support portion 37 to a raised height (height shown in FIGS. 8 and 9) and to a lowered height (height shown in FIGS. 10 and 11) at which the height is lower than the raised height.

The protrusion/retraction operation mechanism 39 includes an extension/contraction link mechanism 39a that extends and contracts in the alignment direction X due to driving performed by an extension/contraction motor (not shown). A relay portion 41 is coupled to the leading end portion of the extension/contraction link mechanism 39a and the base end portion of the extension/contraction link mechanism 39a is coupled to the cover body 40.

Due to the extension/contraction link mechanism 39a being extended and contracted by the extension/contraction motor, the protrusion/retraction operation mechanism 39 moves the third support portion 37 in the alignment direction X, and thus the third support portion 37 is moved to a retraction position (position shown in FIGS. 8 and 11) at which the third support portion 37 is located inside of the cover body 40, and a protrusion position (position shown in FIGS. 9 and 10) at which the third support portion 37 protrudes from the inner portion of the cover body 40 to one side (the first direction X1 side) in the alignment direction X. Note that the protrusion/retraction operation mechanism 39 corresponds to a protrusion/retraction driving portion that causes the third support portion 37 to protrude and retract in the alignment direction X.

Figure 7:
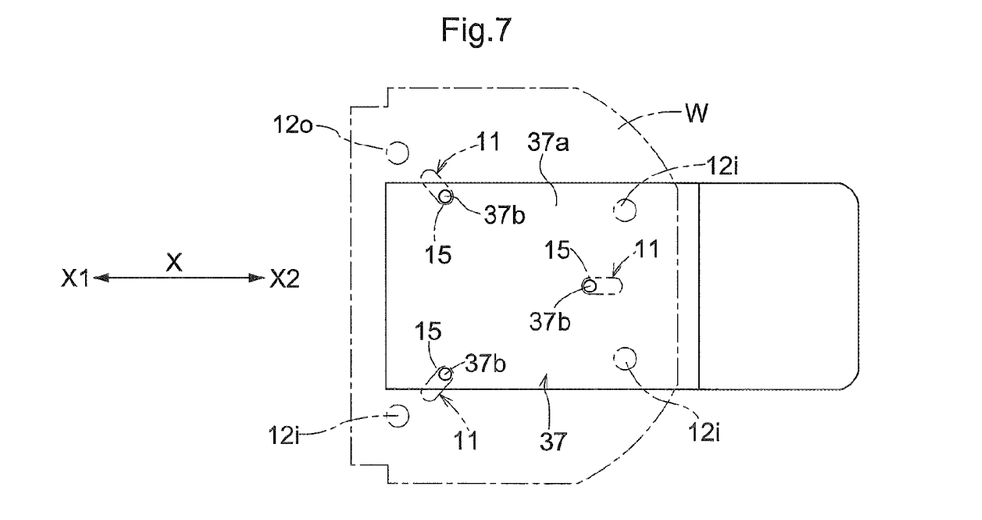
FIG. 7 is a plan view of a third support portion.

As shown in FIG. 7, the third support portion 37 is formed into a rectangular shape in a view in the vertical direction. The size in the width direction Y of the third support portion 37 is smaller than the interval in the width direction Y between the pair of first connected portions 12a and is larger than the interval in the width direction Y between the pair of second connected portions 12b. Also, the third support portion 37 is configured to support the container W in a state in which a portion between the pair of first connected portions 12a on the bottom surface portion 10 of the container W is supported by the third engagement portion 37b and the third base portion 37a overlaps with the pair of second connected portions 12b in a view in the vertical direction.

In a state in which the third support portion 37 is located at the retraction position, the leading end of the third support portion 37 (end on the first direction X1 side of the third support portion 37) is located on the second direction X2 side with respect to the leading end of the first support portion 17 (end on the second direction X2 side of the first support portion 17) and the leading end of the second support portion 18 (end on the second direction X2 side of the second support portion 18) of the storage portion 3.

Also, in the state in which the third support portion 37 is located at the protrusion position, the leading end of the third support portion 37 is located on the first direction X1 side with respect to the leading end of the first support portion 17 and the leading ends of the second support portions 18 of the storage portion 3, and the leading end of the third support portion 37 is located on the first direction X1 side not only with respect to the pair of second connection portions 24b but also with respect to the pair of first connection portions 24a.

In the state in which the third support portion 37 is located at the protrusion position, at least part of a portion located on the first direction X1 side with respect to the pair of second connection portions 24b is formed so as to be larger than an interval in the width direction Y between the pair of second connection portions 24b. For this reason, the movement path when the third support portion 37 moves so as to retract or protrude due to the protrusion/retraction operation mechanism 39 overlaps with the connection portion 24 (second connection portion 24b) in a view in a vertical direction.

The container transport vehicle 1 and the storage portion 3 each include a control unit and a communication unit. The control unit of the container transport vehicle 1 controls the travel portion 31 and the main body portion 32 of the container transport vehicle 1, and the control unit of the storage portion 3 controls the elevation motor 19a. Also, the communication unit of the container transport vehicle 1 and the communication unit of the storage portion 3 are configured to be able to transmit and receive information with each other.

A case will be described in which the container transport vehicle 1 stores the container W in the storage portion 3 in the container transport facility.

Figure 8:
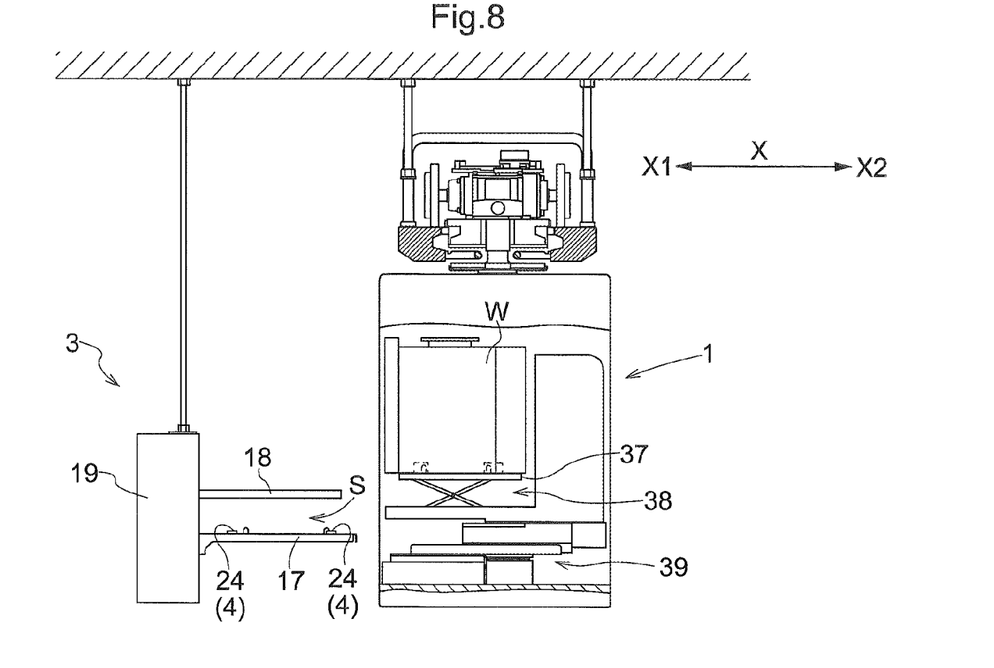
FIG. 8 is a diagram showing a state in which the third support portion is located at a retraction position and at a support height.

As shown in FIG. 8, the container transport vehicle 1 supports the container W and the container W is supported at the raised height. Also, the storage portion 3 is not storing a container W and is in the second state.

Figure 9:
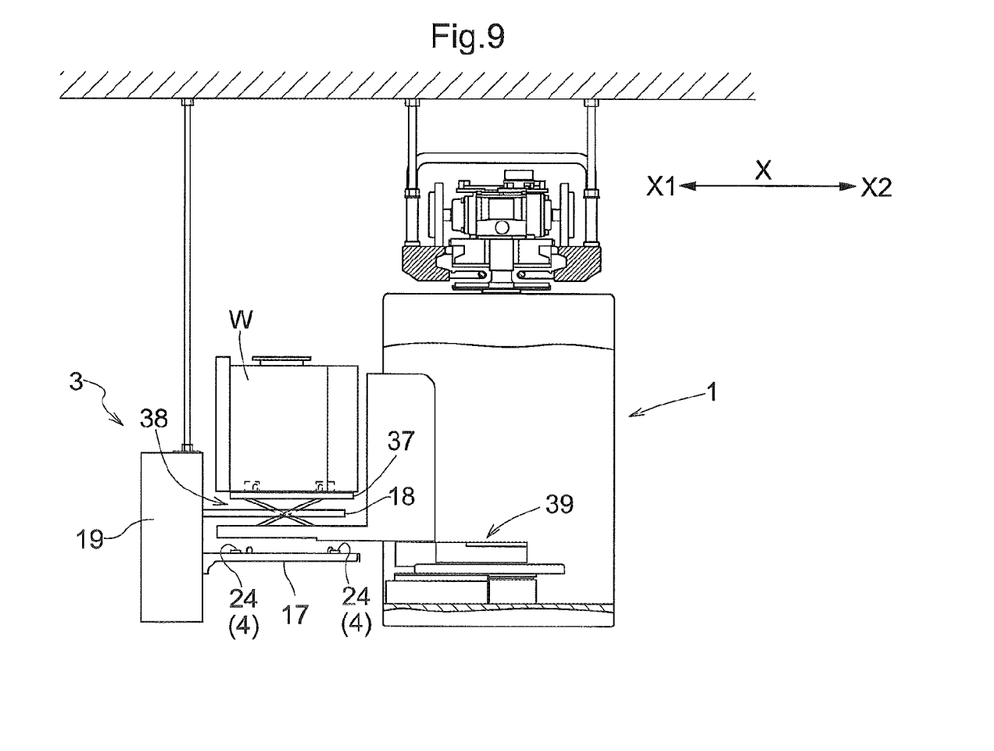
FIG. 9 is a diagram showing a state in which the third support portion is located at a protrusion position and at a support height.
Figure 10:
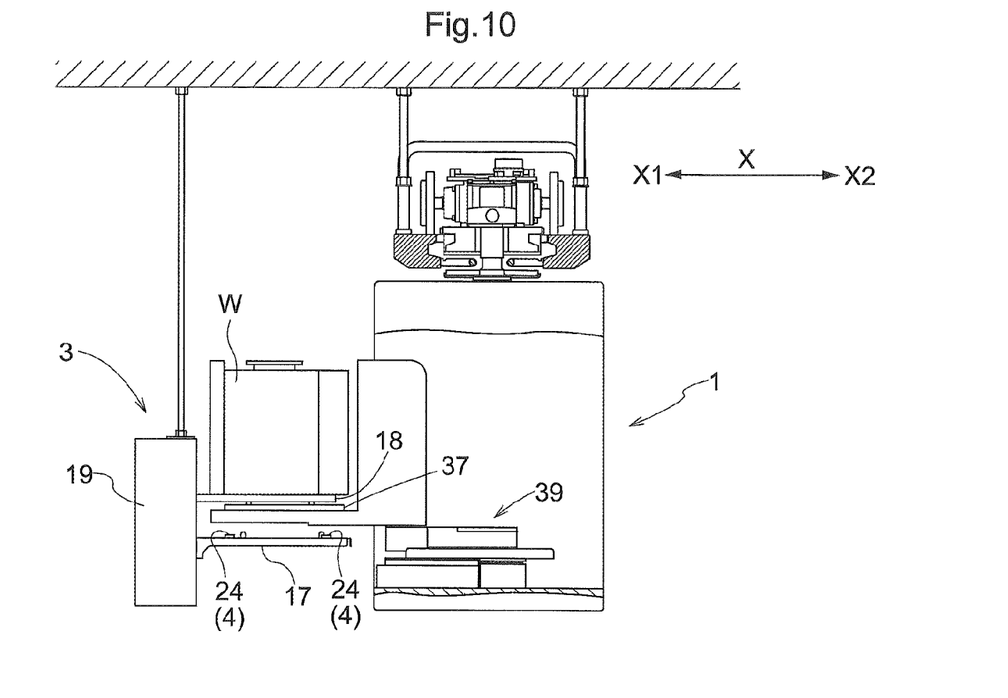
FIG. 10 is a diagram showing a state in which the third support portion is located at a protrusion position and at a withdrawal height.

The container transport vehicle 1 that supports the container W travels to the transfer stopping position corresponding to the storage portion 3 that is the storage target. Then, in a state in which the container transport vehicle 1 is stopped at the transfer stopping position and the storage portion 3 is changed to the second state, as shown in FIG. 9, the third support portion 37 is caused to protrude from the retraction position to the protrusion position, whereafter, as shown in FIG. 10, the third support portion 37 is lowered from the raised height to the lowered height so that the container W is transferred from the third support portion 37 to the second support portions 18, and thereafter, as shown in FIG. 11, the third support portion 37 is caused to retract from the protrusion position to the retraction position.

As shown in FIG. 5, the storage portion 3 lowers the second support portion 18 from the support height to the withdrawal height, changes from the second state to the first state, and transfers the container W from the second support portion 18 to the first support portion 17. Also, in the storage portion 3, if the presence sensor 25 detects that the container W exists on the first support portion 17, the nitrogen gas supply apparatus 4 starts supplying the nitrogen gas.

Next, a case will be described in which the container transport vehicle 1 takes the container W stored in the storage portion 3 in the container transport facility.

Figure 11:
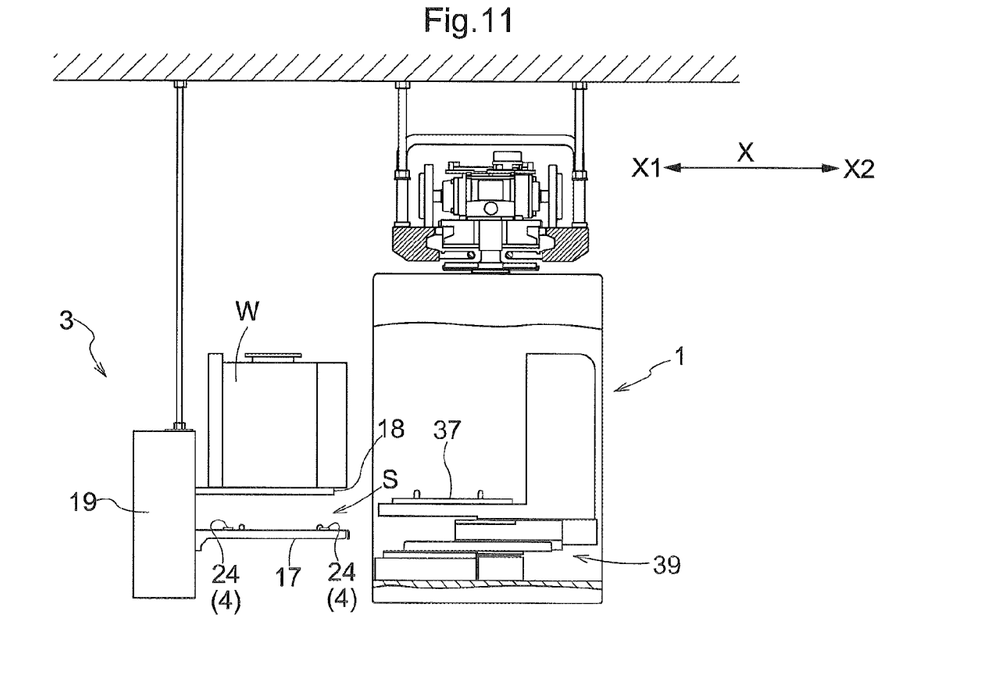
FIG. 11 is a diagram showing a state in which the third support portion is located at a retraction position and at a withdrawal height.

As shown in FIG. 11, the container transport vehicle 1, which is not supporting the container W, travels to the transfer stopping position corresponding to the storage portion 3 from which the container W is to be taken. Also, the second support portion 18 is raised from the withdrawal height to the support height, the storage portion 3 is changed from the first state to the second state, and the container W is transferred from the first support portion 17 to the second support portions 18. Also, in the storage portion 3, if the presence sensor 25 no longer detects that the container W exists on the first support portion 17, the nitrogen gas supply apparatus 4 stops supplying the nitrogen gas.

Then, in a state in which the container transport vehicle 1 is stopped at the transfer stopping position and the storage portion 3 has been changed to the second state, as shown in FIG. 10, the third support portion 37 is caused to protrude from the retraction position to the protrusion position, whereafter, as shown in FIG. 9, the third support portion 37 is raised from the lowered height to the raised height so as to transfer the container W from the second support portion 18 to the third support portion 37, and thereafter, as shown in FIG. 8, the third support portion 37 is caused to retract from the protrusion position to the retraction position.

Thus, the container transport vehicle 1 moves the third support portion 37 so as to protrude and retract using the extension/contraction motor, whereby the third support portion 37 is inserted into the transfer space S in the storage portion 3 in the second state, the container is taken from the storage portion 3 with the container W supported by the third support portion 37, and the container W is stored in the storage portion 3 with the container W supported by the second support portions 18.

Then, in the state in which the storage portion 3 has been changed to the first state, the connection portions 24 of the nitrogen gas supply apparatus 4 are connected to the connected portions 12 of the container W, and therefore the nitrogen gas can be supplied to the interior of the container W. Also, in the state in which the storage portion 3 has been changed to the second state, a transfer space S is formed between the container W and the connection portions 24, and it is therefore possible to take the container W from the storage portion 3 and to store the container W in the storage portion 3 by moving the third support portion 37 so as to protrude or retract and causing the third support portion 37 to enter the transfer space S.

Other Embodiments (1) In the above-described embodiment, the third support portion 37 is formed into a rectangular shape in a view in the vertical direction, but as the shape of the third support portion 37, it is sufficient to use a shape according to which the movement path at a time of moving so as to retract and protrude due to the protrusion/retraction driving portion overlaps with the connection portion 24 in a view in the vertical direction. Specifically, for example, in a state of being located at the protrusion position, the third support portion 37 may be formed into a T shape in a view in the vertical direction by forming a portion on the leading end side with respect to the second connection portion 24b so as to be wider than the interval in the width direction Y between the pair of second connection portions 24*b*, and forming a portion that is the same in the alignment direction X with the second connection portions 24*b* and a portion on the base end side with respect to the second connection portions 24*b* so as to be narrower than the interval in the width direction Y between the pair of second connection portions 24*b*.

(2) In the above-described embodiment, four connection portions 24 are included, but the number of the connection portions 24 may be changed as appropriate, and three or fewer connection portions 24, or five or more connection portions 24 may be included.

Specifically, it is possible to include only a pair of second connection portions 24*b* as the connection portions 24. Also, it is possible to include only three gas supply connection portions 24*i* as the connection portions 24.

(3) In the above-described embodiment, the elevation driving portion (elevation motor 19*a*) is installed on the first direction X1 side with respect to the first support portion 17, but the elevation driving portion may be installed in alignment in the width direction Y with the first support portion 17.

(4) In the above-described embodiment, different portions of the bottom surface portion 10 of the container W are supported from below by the first support portion 17 and the third support portion 37, but it is also possible for the same portions of the bottom surface portion 10 of the container W to be supported from below by the first support portion 17 and the third support portion 37. Also, the connected portions 12 of the bottom surface portion 10 of the container W may be supported from below by the third support portion 37.

(5) In the above-described embodiment, both taking the container W from the storage portion 3 and storing the container W in the storage portion 3 are performed by the transport moving body (container transport vehicle 1), but it is possible for only one of taking the container W from the storage portion 3 and storing the container W in the storage portion 3 to be performed by the transport moving body.

(6) In the above-described embodiment, a FOUP that contains semiconductor substrates is used as the container W, but the shape of the container and the contained item contained in the container may be changed as appropriate, and for example, the container may be a freight container and the contained item may be a food product. Also, other than nitrogen gas, argon gas or the like may be used as the inert gas.

(7) In the above-described embodiment, the transport moving body is a container transport vehicle 1 (ceiling transport vehicle) that includes a travel portion 31 that travels on a travel rail 2, and a main body portion 32 that supports the container W below the travel rail 2. However, the transport moving body may be a container transport vehicle that travels on a travel rail and supports a container above the travel rail, or may be a stacker crane.

Summary of the Above-Described Embodiment

Hereinafter, a summary of the container transport facility described above will be described.

A container transport facility includes: a transport moving body configured to transport a container by moving along a movement route; a storage portion configured to store the container; and an inert gas supply apparatus configured to supply an inert gas to an interior of the container stored in the storage portion, wherein the container has a bottom surface portion including a connected portion, the storage portion includes a first support portion that supports a first supported portion on the bottom surface portion of the container from below, the inert gas supply apparatus includes a connection portion that is connected to the connected portion of the container in a state in which the container is supported by the first support portion, and the inert gas supply apparatus supplies an inert gas from the connection portion to the interior of the container via the connected portion, the storage portion includes: a second support portion configured to support, from below, a second supported portion, which is a portion that is different from the first supported portion on the bottom surface portion of the container and is a portion at which the connected portion does not exist; and an elevation driving portion configured to raise and lower the second support portion, the storage portion being configured to be able to change to a first state and a second state due to the second support portion being raised and lowered by the elevation driving portion, with a height of the container supported by the first support portion being a first height, and a height of the container supported at a height higher than the first height being a second height, the first state is a state in which the second support portion is lowered to be below the second supported portion of the container at the first height and the container can be supported by the first support portion at the first height, the second state is a state in which the second supported portion is raised to be above the second supported portion of the container at the first height and the container can be supported by the second support portion at the second height, the inert gas supply apparatus includes the connection portion at a height at which, in a state in which the storage portion has been changed to the first state, the connection portion is connected to the connected portion of the container at the first height, and in a state in which the storage portion has been changed to the second state, the connection portion is located away from and below the connected portion of the container at the second height and a transfer space is formed between the bottom surface portion of the container and the connection portion, the transport moving body includes: a third support portion that supports, from below, a third supported portion, which is a portion that is different from the second supported portion on the bottom surface portion of the container; and a protrusion/retraction driving portion configured to cause the third support portion to protrude and retract along an alignment direction in which the transport moving body and the storage portion are aligned in a state in which the transport moving body is stopped at a transfer stopping position set on a lateral side of the storage portion, a movement path at the time when the third support portion is moved so as to protrude or retract by the protrusion/retraction driving portion overlaps with the connection portion in a view in the vertical direction, and the transport moving body causes the third support portion to move so as to protrude or retract using the protrusion/retraction driving portion, causing the third support portion to enter the transfer space of the storage portion in the second state, and the transport moving body takes the container from the storage portion with the container supported by the third support portion, or the transport moving body stores the container in the storage portion with the container supported by the second support portion.

According to this characteristic configuration, the storage portion includes the first support portion, the second support portion, and the elevation driving portion. The first support portion supports the first supported portion on the bottom surface portion of the container from below, and the second support portion supports a position different from that of the first supported portion on the bottom surface portion of the container from below. For this reason, by raising or lowering the second support portion using the elevation driving portion, the state of the storage portion can be changed to a first state in which the container can be supported at a first height by the first support portion, and a second state in which the container can be supported at a second height by the second support portion.

Also, in the state in which the storage portion has been changed to the first state, the connection portion of the inert gas supply apparatus is connected to the connected portion of the container, and therefore the inert gas can be supplied to the interior of the container. Also, in the state in which the storage portion has been changed to the second state, the transfer space is formed between the container supported by the second support portion and the connection portion of the inert gas supply apparatus. Accordingly, even if the movement path at the time when the third support portion of the transport moving body is moved so as to protrude or retract by the protrusion/retraction driving portion overlaps with the connection portion in a view in the vertical direction, the third support portion can be moved so as to protrude or retract without interfering with the connection portion, due to the third support portion being moved so as to protrude or retract and entering the transfer space.

Note that when the shape of the third support portion is set, the shape in plan view can be set without giving consideration to interfering with the connection portion at the time when the third support portion is moved so as to protrude or retract. For this reason, the shape of the third support portion is easily formed into a shape that can stably support the container, while the connection portion of the inert gas supply apparatus is supported by the first support portion of the storage portion.

Accordingly, it is possible to provide a container transport facility in which the transport moving body can stably support the bottom surface portion of the container from below, and inert gas can be supplied to the container stored in the storage portion.

Here, it is preferable that with a direction in which the storage portion exists relative to the transport moving body in the alignment direction being a first direction, the third support portion includes an engagement portion, on the first direction side relative to the connected portion on the bottom surface portion, the container includes an engaged portion with which the engagement portion is engaged in the vertical direction, and the engaged portion has a portion that overlaps with the connected portion in a view in the alignment direction.

According to this configuration, the engaged portion is included so as to be located on the first direction side relative to the connected portion, and the engaged portion has a portion that overlaps with the connected portion in a view in the alignment direction. In the case where the connected portion and the engaged portion are in this sort of positional relationship, the movement path of the engagement portion of the third support portion at the time when the third support portion moves so as to protrude or retract overlaps with the connection portion in a view in the vertical direction. However, by changing the storage portion to the second state and storing the container in the storage portion or taking the container from the storage portion, the container can be stored or the container can be taken out without the third support portion interfering with the connection portion.

Also, it is preferable that with a direction orthogonal to the alignment direction in a view in the vertical direction being a width direction, the container includes at least a pair of said connected portions in a state of being aligned in the width direction, and the size in the width direction of the third support portion is greater than an interval in the width direction between the pair of said connected portions.

With this configuration, the third support portion is formed such that its size in the width direction is greater than the interval in the width direction between the pair of connected portions, and therefore the third support portion can support the container with a wide interval in the width direction. For this reason, it is easy for the third support portion to stably support the container.

In the case where the third support portion is formed so as to be wide in the width direction in this way, the movement path of the third support portion overlaps with at least one of the pair of connection portions in a view in the vertical direction. However, by changing the storage portion to the second state and storing or taking out the container, it is possible to store or take out the container without the third support portion interfering with the connection portion.

Also, it is preferable that with a direction in which the storage portion exists relative to the transport moving body in the alignment direction being a first direction, a direction opposite to the first direction being a second direction, and a direction orthogonal to the alignment direction in a view in the vertical direction being a width direction, as the connected portion, the container includes a pair of first connected portions located on the first direction side relative to the center of the container in a view in the vertical direction, and a pair of second connected portions included on the second direction side relative to the center of the container in a view in the vertical direction, the pair of first connected portions are arranged in alignment in the width direction, the pair of second connected portions are arranged between the pair of first connected portions in the width direction, and the third support portion supports a portion between the pair of first connected portions on the bottom surface portion of the container.

According to this configuration, the pair of second connected portions are installed at an interval that is narrower in the width direction compared to that of the pair of first supported portions. Also, the transfer stopping position is set on the second direction side with respect to the storage portion, and from the second direction side, the transport moving body stores the container, which has a portion between the pair of first connected portions on the bottom surface portion that are supported by the third support portion, in the storage portion, or takes the container from the storage portion such that the portion between the pair of first connected portions is supported by the third support portion. At this time, the pair of second connected portions that are provided on the second direction side with respect to the center of the container and are narrow in the width direction are likely to interfere. In view of this, by changing the storage portion to the second state and storing the container in the storage portion or taking the container from the storage portion, the third support portion can store the container or take out the container with interfering with the pair of second connection portions.

Also, it is preferable that with a direction in which the storage portion exists relative to the transport moving body in the alignment direction being a first direction, the elevation driving portion is arranged on the first direction side relative to the first support portion.

According to this configuration, by installing the elevation driving portion and the first support portion in alignment in the alignment direction, it is easier to configure the storage portion to be compact in the direction in which the moving route extends in comparison with the case in which the elevation driving portion and the first support portion are installed in alignment in the direction in which the movement route extends. For this reason, it is easy to install multiple storage portions in alignment along the movement route.

What is claimed is:

1. A container transport facility, comprising:
a transport moving body configured to transport a container by moving along a movement route;
a storage portion configured to store the container; and
an inert gas supply apparatus configured to supply an inert gas to an interior of the container stored in the storage portion,
wherein:
the container has a bottom surface portion including a connected portion,
the storage portion includes a first support portion that supports a first supported portion on the bottom surface portion of the container from below,
the inert gas supply apparatus includes a connection portion that is connected to the connected portion of the container in a state in which the container is supported by the first support portion, and the inert gas supply apparatus supplies an inert gas from the connection portion to the interior of the container via the connected portion,
the storage portion includes: a second support portion configured to support, from below, a second supported portion, which is a portion that is different from the first supported portion on the bottom surface portion of the container and is a portion at which the connected portion does not exist; and an elevation driving portion configured to raise and lower the second support portion, the storage portion being configured to be able to change to a first state and a second state due to the second support portion being raised and lowered by the elevation driving portion, with a height of the container supported by the first support portion being a first height, and a height of the container supported at a height higher than the first height being a second height,
the first state is a state in which the second support portion is lowered to be below the second supported portion of the container at the first height and the container can be supported by the first support portion at the first height,
the second state is a state in which the second support portion is raised to be above the second supported portion of the container at the first height and the container can be supported by the second support portion at the second height,
the inert gas supply apparatus includes the connection portion at a height at which, in a state in which the storage portion has been changed to the first state, the connection portion is connected to the connected portion of the container at the first height, and in a state in which the storage portion has been changed to the second state, the connection portion is located away from and below the connected portion of the container at the second height and a transfer space is formed between the bottom surface portion of the container and the connection portion,
the transport moving body includes: a third support portion that supports, from below, a third supported portion, which is a portion that is different from the second supported portion on the bottom surface portion of the container; and a protrusion/retraction driving portion configured to cause the third support portion to protrude and retract along an alignment direction in which the transport moving body and the storage portion are aligned in a state in which the transport moving body is stopped at a transfer stopping position set on a lateral side of the storage portion, a movement path at the time when the third support portion is moved so as to protrude or retract by the protrusion/retraction driving portion overlaps with the connection portion in a view in the vertical direction, and the transport moving body causes the third support portion to move so as to protrude or retract using the protrusion/retraction driving portion, causing the third support portion to enter the transfer space of the storage portion in the second state, and the transport moving body takes the container from the storage portion with the container supported by the third support portion, or the transport moving body stores the container in the storage portion with the container supported by the second support portion.

2. The container transport facility according to claim 1, wherein:

with a direction in which the storage portion exists relative to the transport moving body in the alignment direction being a first direction, the third support portion includes an engagement portion, on the first direction side relative to the connected portion on the bottom surface portion, the container includes an engaged portion with which the engagement portion is engaged in the vertical direction, and the engaged portion has a portion that overlaps with the connected portion in a view in the alignment direction.

3. The container transport facility according to claim 1, wherein:

with a direction orthogonal to the alignment direction in a view in the vertical direction being a width direction, the container includes at least a pair of said connected portions in a state of being aligned in the width direction, and the size in the width direction of the third support portion is greater than an interval in the width direction between the pair of said connected portions.

4. The container transport facility according to claim 1, wherein:

with a direction in which the storage portion exists relative to the transport moving body in the alignment direction being a first direction, a direction opposite to the first direction being a second direction, and a direction orthogonal to the alignment direction in a view in the vertical direction being a width direction, as the connected portion, the container includes a pair of first connected portions located on the first direction side relative to the center of the container in a view in the vertical direction, and a pair of second connected portions included on the second direction side relative to the center of the container in a view in the vertical direction, the pair of first connected portions are arranged in alignment in the width direction, the pair of second connected portions are arranged between the pair of first connected portions in the width direction, and the third support portion supports a portion between the pair of first connected portions on the bottom surface portion of the container.

5. The container transport facility according to claim 1, wherein:
   with a direction in which the storage portion exists relative to the transport moving body in the alignment direction being a first direction, the elevation driving portion is arranged on the first direction side relative to the first support portion.

\* \* \* \* \*